(12) United States Patent
Willard et al.

(10) Patent No.: US 11,606,065 B2
(45) Date of Patent: *Mar. 14, 2023

(54) BODY TIE OPTIMIZATION FOR STACKED TRANSISTOR AMPLIFIER

(71) Applicant: pSemi Corporation, San Diego, CA (US)

(72) Inventors: Simon Edward Willard, Irvine, CA (US); Chris Olson, Palatine, IL (US); Tero Tapio Ranta, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 76 days.

This patent is subject to a terminal disclaimer.

(21) Appl. No.: 17/021,878

(22) Filed: Sep. 15, 2020

(65) Prior Publication Data

US 2021/0067096 A1 Mar. 4, 2021

Related U.S. Application Data

(63) Continuation of application No. 16/453,287, filed on Jun. 26, 2019, now Pat. No. 10,784,818, which is a
(Continued)

(51) Int. Cl.
*H03F 1/22* (2006.01)
*H03F 1/02* (2006.01)
(Continued)

(52) U.S. Cl.
CPC ........... *H03F 1/0205* (2013.01); *H01L 21/84* (2013.01); *H01L 27/0688* (2013.01);
(Continued)

(58) Field of Classification Search
CPC ........ H03F 1/0205; H03F 1/223; H03F 1/523; H03F 3/193; H03F 3/195; H03F 3/21;
(Continued)

(56) References Cited

U.S. PATENT DOCUMENTS

| | | | |
|---|---|---|---|
| 5,986,507 A | 11/1999 | Itakura et al. |
| 6,392,490 B1 | 5/2002 | Gramegna et al. |

(Continued)

FOREIGN PATENT DOCUMENTS

| | | |
|---|---|---|
| WO | 2018052460 | 3/2018 |
| WO | 2018052539 | 3/2018 |
| WO | 2018052817 | 3/2018 |

OTHER PUBLICATIONS

Shoe, Henry, Office Action received from the USPTO dated Sep. 20, 2019 for U.S. Appl. No. 16/240,601, 27 pgs.
(Continued)

*Primary Examiner* — Khanh V Nguyen
(74) *Attorney, Agent, or Firm* — Jaquez Land Greenhaus & McFarland LLP; Alessandro Steinfl, Esq.

(57) ABSTRACT

A transistor stack can include a combination of floating and body tied devices. Improved performance of the RF amplifier can be obtained by using a single body tied device as the input transistor of the stack, or as the output transistor of the stack, while other transistors of the stack are floating transistors. Transient response of the RF amplifier can be improved by using all body tied devices in the stack.

17 Claims, 10 Drawing Sheets

Related U.S. Application Data continuation of application No. 15/839,648, filed on Dec. 12, 2017, now Pat. No. 10,367,453, which is a continuation of application No. 15/268,257, filed on Sep. 16, 2016, now Pat. No. 9,882,531.

(51) Int. Cl.
  *H01L 49/02* (2006.01)
  *H01L 21/84* (2006.01)
  *H01L 27/12* (2006.01)
  *H01L 29/08* (2006.01)
  *H01L 29/10* (2006.01)
  *H01L 27/06* (2006.01)
  *H03F 3/193* (2006.01)
  *H03F 1/52* (2006.01)
  *H03F 3/195* (2006.01)
  *H03F 3/21* (2006.01)

(52) U.S. Cl.
  CPC .......... *H01L 27/1203* (2013.01); *H01L 28/40* (2013.01); *H01L 29/0847* (2013.01); *H01L 29/1095* (2013.01); *H03F 1/223* (2013.01); *H03F 1/523* (2013.01); *H03F 3/193* (2013.01); *H03F 3/195* (2013.01); *H03F 3/21* (2013.01); *H03F 2200/108* (2013.01); *H03F 2200/297* (2013.01); *H03F 2200/42* (2013.01); *H03F 2200/451* (2013.01); *H03F 2200/48* (2013.01); *H03F 2200/61* (2013.01); *H03F 2200/75* (2013.01)

(58) Field of Classification Search
  CPC ......... H03F 2200/108; H03F 2200/297; H03F 2200/42; H03F 2200/451; H03F 2200/48; H03F 2200/61; H03F 2200/75; H03F 1/22; H03F 2200/294; H03F 3/16; H03F 3/1935; H03F 2200/372; H01L 21/84; H01L 27/0688; H01L 27/1203; H01L 28/40; H01L 29/0847; H01L 29/1095
  USPC .................................. 330/277, 311
  See application file for complete search history.

(56) References Cited

U.S. PATENT DOCUMENTS

| | | | |
|---|---|---|---|
| 6,747,514 B1 | 6/2004 | Aude | |
| 6,831,504 B1 | 12/2004 | Holloway et al. | |
| 7,248,120 B2 | 7/2007 | Burgener et al. | |
| 7,276,976 B2 | 10/2007 | Oh et al. | |
| 7,382,305 B1 | 6/2008 | Murden et al. | |
| 7,649,418 B2 | 1/2010 | Matsui | |
| 7,737,790 B1 | 6/2010 | Chen et al. | |
| 7,859,243 B2 | 12/2010 | Lorenz | |
| 8,111,104 B2 | 2/2012 | Ahadian et al. | |
| 8,446,173 B1 | 5/2013 | Faucher et al. | |
| 8,487,706 B2 | 7/2013 | Li et al. | |
| 8,624,678 B2 * | 1/2014 | Scott ................ | H03F 3/245 330/285 |
| 8,779,859 B2 | 7/2014 | Su et al. | |
| 8,779,860 B2 | 7/2014 | Jeon et al. | |
| 8,823,458 B2 * | 9/2014 | Leuschner ............. | H03F 1/223 330/277 |
| 8,836,429 B2 * | 9/2014 | Murakami .......... | H01L 27/1203 330/307 |
| 8,847,689 B2 * | 9/2014 | Zhao .................. | H03F 3/189 330/285 |
| 8,928,415 B2 | 1/2015 | Cha et al. | |
| 8,987,792 B2 | 3/2015 | Adamski et al. | |
| 9,083,287 B2 | 7/2015 | Papamichail | |
| 9,148,088 B1 | 9/2015 | Ding | |
| 9,219,445 B2 | 12/2015 | Nobbe et al. | |
| 9,287,829 B2 | 3/2016 | Nobbe et al. | |
| 9,413,298 B2 | 8/2016 | Nobbe et al. | |
| 9,509,263 B2 | 11/2016 | Lam | |
| 9,559,644 B2 * | 1/2017 | Maxim ................. | H04B 7/08 |
| 9,641,141 B1 | 5/2017 | Zheng et al. | |
| 9,837,965 B1 | 12/2017 | Wagh et al. | |
| 9,843,293 B1 | 12/2017 | Wagh et al. | |
| 9,874,893 B2 | 1/2018 | Ciubotaru | |
| 9,882,531 B1 | 1/2018 | Willard et al. | |
| 10,181,819 B2 | 1/2019 | Wagh et al. | |
| 10,250,199 B2 | 4/2019 | Klaren et al. | |
| 10,367,453 B2 | 7/2019 | Willard et al. | |
| 10,389,306 B2 | 8/2019 | Wagh et al. | |
| 10,700,642 B2 | 6/2020 | Wagh et al. | |
| 10,784,818 B2 | 9/2020 | Willard et al. | |
| 2002/0158682 A1 | 10/2002 | Conte et al. | |
| 2004/0135639 A1 | 7/2004 | Maneatis | |
| 2005/0206454 A1 | 9/2005 | Richard et al. | |
| 2006/0226910 A1 | 10/2006 | Tanoi | |
| 2007/0075784 A1 * | 4/2007 | Pettersson ........... | H03F 3/45188 330/311 |
| 2009/0302824 A1 | 12/2009 | Kim et al. | |
| 2010/0244964 A1 | 9/2010 | Deguchi et al. | |
| 2010/0329013 A1 | 12/2010 | Shikata et al. | |
| 2011/0025422 A1 | 2/2011 | Marra et al. | |
| 2011/0043284 A1 | 2/2011 | Zhao et al. | |
| 2011/0181364 A1 | 7/2011 | Ahadian et al. | |
| 2012/0139643 A1 | 6/2012 | Scott et al. | |
| 2012/0200338 A1 | 8/2012 | Olson | |
| 2013/0082782 A1 | 4/2013 | Leuschner et al. | |
| 2013/0187712 A1 | 7/2013 | Cabanillas et al. | |
| 2013/0310114 A1 | 11/2013 | Zohny et al. | |
| 2014/0171010 A1 | 6/2014 | Olson | |
| 2014/0184334 A1 | 7/2014 | Nobbe et al. | |
| 2014/0184335 A1 | 7/2014 | Nobbe et al. | |
| 2014/0184336 A1 | 7/2014 | Nobbe et al. | |
| 2014/0184337 A1 | 7/2014 | Nobbe et al. | |
| 2014/0266458 A1 | 9/2014 | Scott et al. | |
| 2014/0266460 A1 | 9/2014 | Nobbe et al. | |
| 2015/0084695 A1 | 3/2015 | Onizuka | |
| 2015/0236650 A1 | 8/2015 | Deo | |
| 2015/0270806 A1 | 9/2015 | Wagh et al. | |
| 2015/0280655 A1 | 10/2015 | Nobbe et al. | |
| 2015/0280672 A1 | 10/2015 | Ding et al. | |
| 2016/0126906 A1 | 5/2016 | Maxim et al. | |
| 2017/0146591 A1 | 5/2017 | Nobbe et al. | |
| 2017/0149437 A1 | 5/2017 | Luo et al. | |
| 2018/0083578 A1 | 3/2018 | Klaren et al. | |
| 2018/0131327 A1 | 5/2018 | Wagh et al. | |
| 2018/0159475 A1 | 6/2018 | Willard et al. | |
| 2019/0158029 A1 | 5/2019 | Wagh et al. | |
| 2019/0158031 A1 | 5/2019 | Klaren et al. | |
| 2019/0379330 A1 | 12/2019 | Willard et al. | |
| 2020/0036340 A1 | 1/2020 | Yoshimasu et al. | |
| 2020/0358402 A1 | 11/2020 | Wagh et al. | |

OTHER PUBLICATIONS

Choe, Henry, Notice of Allowance received from the USPTO dated Feb. 14, 2020 for U.S. Appl. No. 16/240,601, 10 pgs.

Nguyen, Patricia T., Notice of Allowance received from the USPTO dated Apr. 16, 2020 for U.S. Appl. No. 16/250,889, 47 pgs.

Mottola, Steven J., Office Action received from the USPTO dated Dec. 5, 2019 for U.S. Appl. No. 16/453,287, 22 pgs.

Mottola, Steven J., Notice of Allowance received from the USPTO dated Mar. 19, 2020 for U.S. Appl. No. 16/453,287, 9 pgs.

Mottola, Steven J., Notice of Allowance received from the USPTO dated May 20, 2020 for U.S. Appl. No. 16/453,287, 9 pgs.

Mottola, Steven J., Office Action received from the USPTO dated Dec. 3, 2018 for U.S. Appl. No. 15/839,648, 22 pgs.

Mottola, Steven J., Notice of Allowance received from the USPTO dated Mar. 13, 2019 for U.S. Appl. No. 15/839,648, 13 pgs.

pSemi Corporation, Response filed in the USPTO dated Feb. 15, 2019 for U.S. Appl. No. 15/839,648, 8 pgs.

pSemi Corporation, Preliminary Amendment filed in the USPTO dated Feb. 21, 2018 for U.S. Appl. No. 15/839,648, 4 pgs.

Nguyen, Patricia T., Notice of Allowance received from the USPTO dated Nov. 30, 2018 for U.S. Appl. No. 15/268,229, 33 pgs.

(56) References Cited

OTHER PUBLICATIONS

Choe, Henry, Notice of Allowance received from the USPTO dated Dec. 18, 2018 for U.S. Appl. No. 15/690,115, 31 pgs.
Kurzbauer, Werner, Written Opinion received from the EPO dated Aug. 15, 2018 for appln. No. PCT/US2017/050839, 8 pgs.
Nguyen, Patricia T., Notice of Allowance received from the USPTO dated Sep. 12, 2018 for U.S. Appl. No. 15/785,096, 12 pgs.
Wienema, David, Written Opinion received from the EPO dated Aug. 9, 2018 for appln. No. PCT/US2016/057052, 8 pgs.
Pornpromlikit, et al., "A Watt-Level Stacked-FET Linear Power Amplifier in Silicon-on-Insulator CMOS", IEEE Transactions on Microwave Theory and Techniques, IEEE Serive Center, Piscataway, NJ, US., vol. 58, No. 1, Jan. 1, 2010, pp. 57-64.
Wienema, David, Written Opinion received from the EPO dated Aug. 6, 2018 for appln. No. PCT/US2017/044015, 14 pgs.
Mottola, Steven J., Office Action received from the USPTO dated Jul. 11, 2017 for U.S. Appl. No. 15/268,257, 22 pgs.
Mottola, Steven J., Notice of Allowance received from the USPTO dated Nov. 24, 2017 for U.S. Appl. No. 15/268,257, 18 pgs.
Willard, et al., Response filed in the USPTO dated Sep. 20, 2017 for U.S. Appl. No. 15/268,257, 14 pgs.
Kurzbauer, Werner, International Search Report and Written Opinion received from the EPO dated Dec. 8, 2017 for appln. No. PCT/US2017/050839, 13 pgs.
Klaren, et al., Response filed in the USPTO dated Jan. 29, 2018 for U.S. Appl. No. 15/268,229, 7 pgs.
Nguyen, Patricia T., Office Action received from the USPTO dated May 3, 2018 or U.S. Appl. No. 15/268,229, 34 pgs.
Nguyen, Patricia T., Office Action received from the USPTO dated May 18, 2018 or U.S. Appl. No. 15/785,096, 13 pgs.
Choe, Henry, Office Action received from the USPTO dated Apr. 12, 2018 for U.S. Appl. No. 15/690,115, 18 pgs.
Wienema, David, Written Opinion of the International Preliminary Examining Authority received from the EPO dated Nov. 27, 2018 for appln. No. PCT/US2016/057052, 9 pgs.
Matthys, Griet, International Preliminary Report on Patentability received from the USPTO dated Dec. 12, 2018 for appln. No. PCT/US2017/044015, 39 pgs.
Wienema, David, International Preliminary Report on Patentability received from the EPO dated Jan. 4, 2019 for appln. No. PCT/US2016/057052, 39 pgs.
Kurzbauer. Werner, International Preliminary Report on Patentability received from the EPO dated Jan. 30, 2019 for appln. No. PCT/US2017/050839, 7 pgs.
Nguyen, Patricia T., Office Action received from the USPTO dated Dec. 11, 2017 for U.S. Appl. No. 15/268,229, 6 pgs.

Wagh, et al., "Standby Voltage Condition for Fast RF Amplifier Bias Recovery", U.S. Appl. No. 15/268,297, filed in the Sep. 16, 2016, 53 pgs.
Klaren, et al., "Cascode Amplifier Bias Circuits", U.S. Appl. No. 15/268,229, filed in the Sep. 16, 2016, 62 pgs.
Wagh, et al., "Gate Drivers for Stacked Transistor Amplifiers", U.S. Appl. No. 15/268,275 filed in the USPTO on Sep. 16, 2016, 67 pgs.
Klaren, et al., Preliminary Amendment filed in the USPTO dated Nov. 29, 2016 for U.S. Appl. No. 15/268,229, 11 pgs.
Willard, Simon, "Butted Body Contact for SOI Transistor", U.S. Appl. No. 14/945,323 filed in the USPTO on Nov. 18, 2015, 85 pgs.
Willard, Simon, "Butted Body Contact for SOI Transistor", U.S. Appl. No. 15/078,930 filed in the USPTO on Mar. 23, 2016, 121 pgs.
Leuschner, et al., "A 31-dBm, High Ruggedness Power Amplifier in 65-nm Standard CMOS with High-Efficiency Stacked-Cascode Stages", 2010 IEEE Radio Frequency Integrated Circuits Symposium, pp. 395-398.
Carrara, et al., "A 2.4-GHz 24-dBm SOI CMOS Power Amplifier with Fully Integrated Reconfigurable Output Matching Network", IEEE Transactions on Microwave Theory and Techniques, vol. 57, No. 9, Sep. 2009, pp. 2122-2130.
PornPromLikit, et al., "A 33-dBm 1.9-GHz Silicon-on-Insulator CMOS Stacked-FET Power Amplifier", IEEE 2009, pp. 533-536.
Choe, Henry, Notice of Allowance received from the USPTO dated Oct. 24, 2017 for U.S. Apl. No. 15/268,275, 14 pgs.
Nguyen, Patricia T., Notice of Allowance received from the USPTO dated Sep. 22, 2017 for U.S. Appl. No. 15/268,297, 13 pgs.
Nguyen, Patricia T., Notice of Allowance received from the USPTO dated Jun. 26, 2017 for U.S. Appl. No. 15/268,297, 31 pgs.
Wagh, et al., Response filed in the USPTO dated Jun. 27, 2017 for U.S. Appl. No. 15/268,275, 4 pgs.
Choe, Henry, Notice of Allowance received from the USPTO dated Jul. 24, 2017 for U.S. Appl. No. 15/268,275, 25 pgs.
Wienema, David, International Search Report and Written Opinion received from the EPO dated Aug. 31, 2017 for appln. No. PCT/US2017/044015, 19 pgs.
Arias-Kraska, Agnieszka, International Search Report and Written Opinion received from the EPO dated May 10, 2017 for appln. No. PCT/US2016/057052, 15 pgs.
Nguyen, Patricia T., Office Action received from the USPTO dated Mar. 9, 2017 for U.S. Appl. No. 15/268,297, 7 pgs.
Wagh, et al., Response to Office Action filed in the USPTO dated Mar. 27, 2017 for U.S. Appl. No. 15/268,297, 8 pgs.
Nguyen, Patricia T., Notice of Allowance received from the USPTO dated Jul. 15, 2019 for U.S. Appl. No. 16/283,298, 8 pgs.

* cited by examiner

BODY TIE OPTIMIZATION FOR STACKED TRANSISTOR AMPLIFIER

CROSS REFERENCE TO RELATED APPLICATIONS—CLAIM OF PRIORITY

This application is a continuation of, and claims the benefit of priority under 35 USC § 120 of, commonly assigned and co-pending prior U.S. application Ser. No. 16/453,287, filed Jun. 26, 2019, "Body Tie Optimization for Stacked Transistor Amplifier", the disclosure of which is incorporated herein by reference in its entirety. Application Ser. No. 16/453,287 is a continuation of, and claims the benefit of priority under 35 USC § 120 of, commonly assigned prior U.S. application Ser. No. 15/839,648, filed Dec. 12, 2017, "Body Tie Optimization for Stacked Transistor Amplifier", now U.S. Pat. No. 10,367,453, issued Jul. 30, 2019, the disclosure of which is incorporated herein by reference in its entirety. Application Ser. No. 15/839,648 is a continuation of, and claims the benefit of priority under 35 USC § 120 of, commonly assigned prior U.S. application Ser. No. 15/268,257, filed Sep. 16, 2016, "Body Tie Optimization for Stacked Transistor Amplifier", now U.S. Pat. No. 9,882,531, issued on Jan. 30, 2018, the disclosure of which is incorporated herein by reference in its entirety. The present application is related to U.S. application Ser. No. 15/268,297 entitled "Standby Voltage Condition for Fast RF Amplifier Bias Recovery", filed on Sep. 16, 2016, now U.S. Pat. No. 9,837,965, issued on Dec. 5, 2017, the disclosure of which is incorporated herein by reference in its entirety. The present application is also related to U.S. application Ser. No. 15/268,229 entitled "Cascode Amplifier Bias Circuits" filed on Sep. 16, 2016, now U.S. Pat. No. 10,250,199, issued on Apr. 2, 2019, the disclosure of which is incorporated herein by reference in its entirety. The present application is also related to U.S. application Ser. No. 15/268,275 entitled "Gate Drivers for Stacked Transistor Amplifiers" filed on Sep. 16, 2016, now U.S. Pat. No. 9,843,293, issued on Dec. 12, 2017, the disclosure of which is incorporated herein by reference in its entirety The present application may be related to U.S. application Ser. No. 14/945,323, entitled "Butted Body Contact for SOI Transistor", filed on Nov. 18, 2015, the disclosure of which is incorporated herein by reference in its entirety. The present application may also be related to Published US Application No. 2014/0171010 A1, published Jun. 19, 2014, entitled "Semiconductor Devices with Switchable Ground-Body Connection", the disclosure of which is incorporated herein by reference in its entirety. The present application may also be related to U.S. application Ser. No. 15/078,930, entitled "Butted Body Contact for SOI Transistor", filed on Mar. 23, 2016, now U.S. Pat. No. 9,842,858, issued on Dec. 12, 2017, the disclosure of which is incorporated herein by reference in its entirety. The present application may also be related to U.S. Pat. No. 8,987,792 B2, entitled "Merged Active Devices on a Common Substrate", issued Mar. 24, 2015, the disclosure of which is incorporated herein by reference in its entirety. The present application may also be related to U.S. Pat. No. 7,248,120, issued on Jul. 24, 2007, entitled "Stacked Transistor Method and Apparatus", the disclosure of which is incorporated herein by reference in its entirety. The present application may also be related to Published US Application No. 2015/0270806 A1, published Sep. 24, 2015, entitled "Bias Control for Stacked Transistor Configuration", the disclosure of which is incorporated herein by reference in its entirety. The present application may also be related to Published US Application No. US 2014/0184336 A1, published Jul. 3, 2014, entitled "Amplifier Dynamic Bias Adjustment for Envelope Tracking", the disclosure of which is incorporated herein by reference in its entirety. The present application may also be related to U.S. Pat. No. 9,219,445 entitled "Optimization Methods for Amplifiers with Variable Supply Power", issued Dec. 22, 2015, the disclosure of which is incorporated herein by reference in its entirety. The present application may also be related to U.S. Pat. No. 8,487,706 B2 entitled "Stacked Linear Power Amplifier with Capacitor Feedback and Resistor Isolation", issued Jul. 16, 2013, the disclosure of which is incorporated herein by reference in its entirety. The present application may also be related to Published US Application No. 2014/0184335 A1, entitled "Amplifiers Operating in Envelope Tracking Mode or Non-Envelope Tracking Mode", the disclosure of which is incorporated herein by reference in its entirety. The present application may also be related to Published US Application No. 2014/0184337 A1, entitled "Control Systems and Methods for Power Amplifiers Operating in Envelope Tracking Mode", the disclosure of which is incorporated herein by reference in its entirety.

BACKGROUND

1. Field

Various embodiments described herein relate generally to systems, methods, and apparatus for optimizing performance of radio frequency (RF) amplifiers that use stacked transistors.

2. Description of Related Art

Floating body silicon-on-insulator (SOI) transistors are limited in operating voltage and power due to accumulated hot carriers which can increase the electrical potential of the body region of the SOI transistors. Body tied SOI transistors have been shown to extend voltage and power handling capabilities when compared to floating body SOI transistors.

Floating body SOI transistors have shown non-conducting hot carrier drift (e.g. magnitude of threshold voltage to decrease and the drain current to increase when in the non-conducting state) for drain to source voltage ($V_{DS}$) larger than about 3.2 volts. Body tied devices have been shown to not suffer from this mechanism.

When a floating body transistor is conducting, a corresponding floating body effect (e.g., kink) can cause abrupt reduction of output impedance of the transistor under moderate bias at various levels of drain to source voltage of the transistor, which in turn, can reduce analog gain of the transistor and increase complexity of a corresponding device modeling. Body tied devices (transistors) suppress the reduction of the output impedance and extend the range of higher output impedance to higher drain to source voltages.

Body ties on wide (large gate width) transistors with conventional (e.g., H-gate, T-gate or other) body tie structures become less effective in suppressing device degradations due to high resistance and increased parasitic capacitance which mitigate the ability to control the floating body effects. In particular, conventional body tied devices (e.g. H-gate, T-gate or other) are less effective in suppressing such degradations for large transistor width and the added drain to gate capacitance associated with conventional body tied devices can degrade performance in applications where such transistors are used, such as, for example, radio frequency (RF) amplifier applications.

Although body ties can improve transistor voltage capability, other performance of the transistor, including ON state conduction and speed (e.g., $f_T$, $f_{MAX}$), can be degraded. Such degradation can be due to several factors, such as an increase in parasitic capacitance, where the parasitic capacitance can be nonlinear; a larger layout area necessary for a body tied transistor; or, in some cases, limitations of design tools whose design rules prevent design of merged transistors with body ties, therefore further increasing layout area.

For the above reasons, and in spite of benefits provided by body ties, traditional RF amplifiers using stacked SOI devices have not been fitted with body ties. It should be added that, as known to person skilled in the art, bulk CMOS devices inherently have body ties and therefore do not suffer from symptoms affecting SOI devices without body ties, such as, for example, partially depleted and fully depleted CMOS devices without body ties. Although capacitance reduction due to the absence of body ties in SOI devices can provide some performance advantages (e.g., speed) over bulk CMOS devices, other performance parameters may suffer (e.g., voltage capability).

SUMMARY

According to a first aspect of the present disclosure, a circuital arrangement is presented, the circuital arrangement comprising: a transistor stack configured to operate as a radio frequency (RF) amplifier, the transistor stack comprising a plurality of stacked transistors comprising an input transistor for receiving an input RF signal to the amplifier, and an output transistor for outputting an output RF signal that is an amplified version of the input RF signal; the transistor stack configured to operate between a supply voltage coupled to the output transistor and a reference voltage coupled to the input transistor, wherein at least one transistor of the plurality of stacked transistors is a four-terminal transistor, and remaining transistors of the plurality of transistors are three-terminal transistors.

According to a second aspect of the present disclosure, a method for manufacturing a radio frequency (RF) amplifier is presented, the method comprising: providing a substrate comprising one of: a) silicon-on-insulator substrate, and b) a silicon-on-sapphire substrate; manufacturing, on the substrate, a transistor stack configured to operate as a radio frequency (RF) amplifier, the transistor stack comprising a plurality of series connected transistors comprising at least one four-terminal transistor and a remaining three-terminal transistor.

According to a third aspect of the present disclosure, a method for improving a performance of a radio frequency (RF) amplifier is presented, the method comprising: providing a plurality of floating devices; configuring the plurality of floating devices as a cascoded stack; based on the configuring, obtaining an RF amplifier having a characteristic performance; replacing, in the cascoded stack, at least one floating device of the plurality of floating devices with a body tied device; based on the replacing, obtaining an RF amplifier having an improved characteristic performance; and fabricating the RF amplifier with improved characteristic performance on one of: a) silicon-on-insulator (SOI) technology, and b) silicon-on-sapphire technology (SOS).

According to a fourth aspect of the present disclosure, a method for reducing a stack height of an RF amplifier is presented, the method comprising: providing a level of a voltage across a stack; providing a withstand voltage capability of a three-terminal device; based on the level of the voltage and the withstand voltage capability, determining a height of the stack based on a required number of series connected three-terminal devices in the stack; replacing one or more of the series connected three-terminal devices with one or more four-terminal devices; based on the replacing, reducing the height of the stack; and fabricating the RF amplifier with reduced stack height on one of: a) silicon-on-insulator (SOI) technology, and b) silicon-on-sapphire technology (SOS).

BRIEF DESCRIPTION OF THE DRAWINGS

The accompanying drawings, which are incorporated into and constitute a part of this specification, illustrate one or more embodiments of the present disclosure and, together with the description of example embodiments, serve to explain the principles and implementations of the disclosure.

Like reference numbers and designations in the various drawings indicate like elements.

DETAILED DESCRIPTION

Throughout the present description, embodiments and variations are described for the purpose of illustrating uses and implementations of the inventive concept. The illustrative description should be understood as presenting examples of the inventive concept, rather than as limiting the scope of the concept as disclosed herein.

Throughout the present description, the terms "transistor" and "device" are synonymous and can be used interchangeably.

Throughout the present description, a "three-terminal" transistor is referred to as a transistor whose body is not tied to a potential and is therefore floating. A person skilled in the art would know that another expression for a three-terminal transistor is a "floating transistor". Therefore, the expressions "three-terminal" transistor and "floating" transistor are synonymous and are used interchangeably in the present description.

Throughout the present description, a "four-terminal" transistor is referred to as a transistor whose body is tied to a potential by way of a body tie connection. A person skilled in the art would know that another expression for such transistor is a "body tied" transistor. Therefore, the expressions "four-terminal" transistor and "body tied" transistor are synonymous and are used interchangeably in the present description.

Apparatus, and methods for making and using such apparatus, that provide all the benefits of conventional body tied devices, such as H-gate and T-gate structures for MOSFET devices, without some of the limitations and degradations associated with those structures are described in the above referenced U.S. application Ser. No. 14/945,323 and U.S. application Ser. No. 15/078,930, both entitled "Butted Body Contact for SOI Transistor", whose disclosures are incorporated herein by reference in their entirety.

A body tie, according to various known embodiments, is implemented via provision of some additional structures to a semiconductor structure that forms the transistor, which can result in a larger transistor with higher capacitance (e.g. gate capacitance), and therefore, a slower transistor. This is a main reason why traditionally RF amplifiers have not been using transistors with body ties.

As known to a person skilled in the art, such body tie can be provided by "tying", via a conduction path of a desired conductivity (e.g. resistivity), a body region of the transistor to a source region of the transistor. Alternatively, the body tie can be provided as an open contact for tying the body region of the transistor to any desired external potential provided at the open contact, the open contact being resistively connected to the body region of the transistor device via a conduction path of a desired conductivity.

Figure 1A:
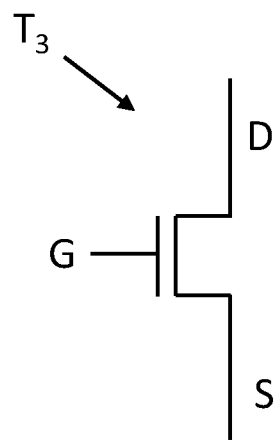
FIG. 1A shows a schematic representation of a three-terminal N-type MOSFET transistor device.
Figure 2:
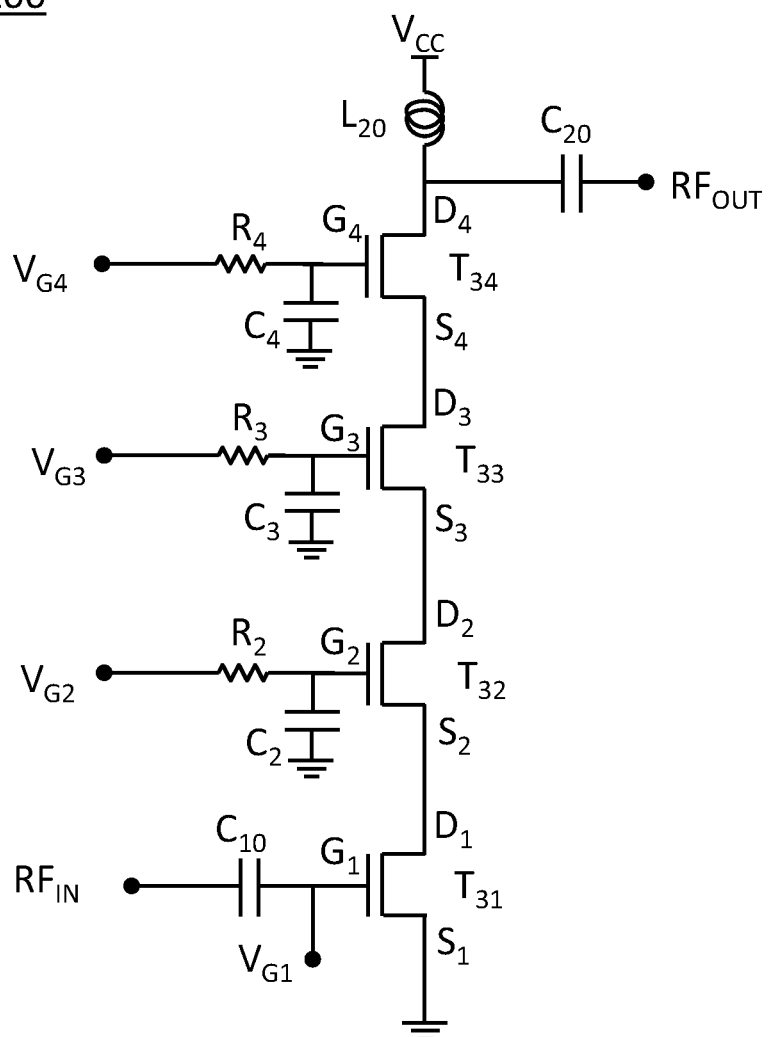
FIG. 2 shows a schematic representation of a traditional transistor stack operating as an RF amplifier, where the transistor stack is formed by series connected three-terminal devices, and includes an input device for inputting an RF signal to be amplified, and an output device for outputting an amplified version of the RF signal.

The embodiments as described herein are exemplified by an N-type MOSFET device, as shown in FIG. 1A, used as a main conduction element of an RF amplifier. Such device can be part of a stack where a plurality of such devices are connected in series so as to operate as a cascode, as shown in FIG. 2. A person of ordinary skill in the art will readily apply the inventive concepts as disclosed herein to other types of semiconductor devices, such as a P-type MOSFET device. The embodiments, according to the present invention, can also be applied to extended drain devices, such as laterally diffused metal oxide semiconductor (LDMOS) devices, and other gated transistors or devices.

According to various embodiments of the present disclosure, FET devices T3 and T4 may include metal-oxide-semiconductor (MOS) field effect transistors (FETs), complementary metal-oxide-semiconductor (CMOS) FETs, and particularly to MOSFETs and CMOSFETs fabricated on silicon-on-insulator (SOI) and silicon-on-sapphire (SOS) substrates.

Figure 1B:
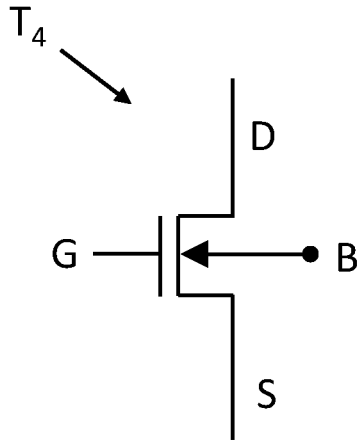
FIG. 1B shows a schematic representation of a four-terminal N-type MOSFET transistor device, where a fourth terminal can be used for a body tie to any desired potential.
Figure 1C:
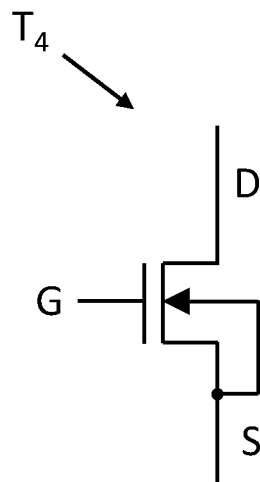
FIG. 1C shows a schematic representation of the four-terminal transistor device of FIG. 2B, where the body is tied to a source of the transistor.

A person skilled in the art readily knows that an SOI MOSFET device (e.g. T3, T4 of FIG. 1A, 1B) can be formed in a thin layer of silicon which overlies an insulating layer of an SOI substrate. Accordingly, and as known in the art, the SOI MOSFET device can be referred to as a thin-film SOI MOSFET, the thin-film referring to the thin layer of silicon. It should be noted that the various embodiments according to the present disclosure which will be described below can be implemented in thin-film SOI MOSFET devices. A more detailed description of such SOI MOSFET device can be found, for example, in the above referenced U.S. application Ser. No. 14/945,323, U.S. application Ser. No. 15/078,930, and U.S. Pat. No. 8,987,792 B2, whose disclosures are incorporated herein by reference in their entirety The MOSFET (FET) transistor T3, whose schematic representation is shown in FIG. 1A, is a three-terminal device, including a gate terminal, G, a source terminal, S, and a drain terminal, D. Due to its inherent smaller size, transistor T3 is a faster device and has traditionally been used in RF amplification implementations. In contrast, the MOSFET transistor T4, whose schematic representation is shown in FIG. 1B, is a four-terminal device, including a gate terminal, G, a source terminal, S, a drain terminal, D, and a body terminal, B. In the exemplary case depicted in FIG. 1B, the body terminal, B, is shown as an open terminal which can be tied to any desired (fixed) potential. In an exemplary embodiment, the body terminal, B, can be tied to the source terminal, S, of the transistor T4, as shown in FIG. 1C.

The body tie provided to the device T4 can extend voltage and power handling capabilities of the device. According to the various embodiments of the present disclosure, such semiconductor devices fitted with a body tie structure can be used, for example, in radio frequency (RF) amplifiers, including, but not limited to, RF power amplifiers and cellular RF power amplifiers operating at various classes of operation, including, but not limited to, switching class D, E and F, saturated class B and C, and linear class A and A/B. A body tie used in one or more transistors of a transistor stack operating as an RF amplifier, according to the various embodiments of the present disclosure, can improve operating performance of the RF amplifier.

According to the various embodiments of the present disclosure, a stack of transistors operating as an RF amplifier can have a combination of three-terminal and four-terminal devices in the stack. According to an exemplary embodiment of the present disclosure, an input transistor of the stack can be a four-terminal device and all other transistors of the stack can be three-terminal transistors (e.g., FIG. 3A, FIG. 3B). According to another exemplary embodiment of the present disclosure, an output transistor of the stack can be a four-terminal device and all other transistors of the stack can be three-terminal transistors (e.g., FIG. 4A, FIG. 4B). According to yet another exemplary embodiment of the present disclosure, an input transistor of the stack and an output transistor of the stack can be a four-terminal device and all other transistors of the stack can be three-terminal transistors (e.g., FIG. 5A, FIG. 5B). According to yet another exemplary embodiment of the present disclosure, all of the transistors of the stack can be four-terminal transistors (e.g., FIG. 6A). According to yet another exemplary embodiment of the present disclosure, any one or more transistors of the stack can be a four-terminal device while remaining one or more transistors being three-terminal devices (e.g., FIG. 6B). By using a combination of three-terminal and four-terminal device in the stack of transistors, operating performance of the RF amplifier can be improved.

Further clarification of the above embodiments according to the present disclosure, will be provided in the ensuing sections of the present disclosure with references to associated figures.

Figure 1D:
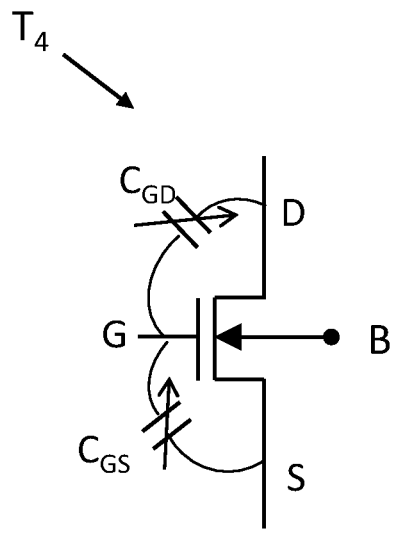
FIG. 1D shows a more detailed schematic representation of the four-terminal MOSFET transistor device of FIG. 1B, including a gate-to-source capacitance and a gate-to-drain capacitance.

With further reference to the four-terminal transistor, T4, of FIG. 1B and FIG. 1C, the body tie structure can reduce the floating body effects present in the three-terminal transistor T3 of FIG. 1A, at the cost of some added parasitic capacitance ($C_{SG}$) between the gate and the source of the transistor T4, as well as added parasitic capacitance ($C_{DG}$) between the gate and the drain of the transistor T4. Parasitic capacitances ($C_{SG}$, $C_{DG}$) are shown in FIG. 1D (as variable capacitances, since corresponding capacitance value can change as a function of the voltage applied to the transistor terminals), which schematically represents transistor T4, including the body terminal (contact) which provides for a connection of a desired potential. The person skilled in the art readily knows the ill effects of such parasitic capacitances in the performance of the transistor T4, which, amongst others, can reduce a switching speed of the transistor, as well as reduce characteristic operating frequencies $f_T$ and $f_{max}$ of the transistor T4 using the body tie. Due to the non-constant nature of the parasitic capacitances ($C_{SG}$, $C_{DG}$), such capacitances can also negatively affect linearity of the transistor T4.

On the other hand, the four-terminal transistor T4 can exhibit performance advantages when compared to the three-terminal transistor T3. Such performance advantages include, but are not limited to, improved control of majority carriers and electrical potential in the body region of the transistor. When compared to a floating body transistor T3, the body tied transistor T4 can provide a higher breakdown voltage, lower drain to source current ($I_{DS}$) in the OFF state (non-conducting state) at elevated drain to source voltages ($V_{DS}$), less decrease in output impedance with increased $V_{DS}$ in the ON state (conducting state), and improved HCI (hot carrier injection) performance for RF applications.

Applicant of the present disclosure has found that careful construction of a body tie structure used in one or more body tied transistors of a stack operating as an RF amplifier, and careful layout of such transistors, can negate some of the ill effects of using body ties, and therefore provide less total gate parasitic capacitance (sum of all capacitances attached to the gate), less drain to gate capacitance (no increase over floating body transistor), and higher $f_{max}$ (due to reduced drain to gate capacitance). In addition, such RF amplifier can benefit of the inherent characteristic benefits of the body tied transistors, including improved output impedance and breakdown voltage, which in turn, can provide improved performance of the RF amplifier, such as, for example, a higher peak power added efficiency (PAE), improved transient response, and improved RF swing absorption capability.

FIG. 2 shows a simplified schematic of a prior art stacked cascode (RF) amplifier (200). By way of example and not of limitation, the stacked cascode amplifier (200) can comprise a stack of FET transistors (T31, T32, T33, T34) that include a three-terminal input transistor T31, three-terminal cascode transistors (T34, T32, T32), and a three-terminal output transistor T34. An input RF signal, RFin, provided at a gate terminal of the input transistor T31 of the amplifier (200) is amplified by the amplifier (200). A corresponding amplified output RF signal, RFout, is provided at a drain of the output transistor, T34, and routed to an output terminal of the amplifier through a bypass capacitor C20. Bypass capacitors C10 and C20 can be used to decouple low frequency (e.g., DC) biasing voltages provided to the stack of transistors (transistor stack) from the RFin and RFout signals. A supply voltage, $V_{CC}$, is provided to the drain of the output transistor, T34, through an inductor, L20, and a reference voltage (e.g., GND) is connected to a source of the input transistor T31. Biasing voltages at nodes ($V_{G4}$, $V_{G3}$, $V_{G2}$) are provided to respective gates of the cascode transistors (T34, T33, T32) via series resistors (R4, R3, R2). Biasing voltage to the input transistor, T31, can be provided at the node $V_{G1}$. Various biasing circuits to generate such gate voltages to the RF amplifier (200) are described, for example, in the above referenced U.S. Pat. Nos. 9,219,445, 8,487,706 B2, to Published US Application No. 2014/0184335 A1, Published US Application No. US 2014/0184336 A1, Published US Application No. 2014/0184337 A1, and Published US Application No. 2015/0270806.

A person skilled in the art would know that FET transistors (T31, T32, T33, T34) are configured as a four-stage cascode amplifier. Teachings from other documents, such as the above referenced U.S. Pat. No. 8,487,706 B2, whose disclosures is incorporated herein by reference in its entirety, further describe stacked cascode amplifiers and methods to minimize output signal distortion by way, for example, of biasing the various gates of the transistors within the stack. The person skilled in the art may use these teaching for further specifics on multi-stage stacked transistors in a cascode configuration, where the stack of FET transistors comprises a number of transistors different from four, such as, for example, 2, 3, 5, 6, 7, 8 or more.

Although the amplifier (200) of FIG. 2 is shown to be powered by a fixed supply voltage $V_{CC}$, other configurations of the amplifier (200) where the supply voltage is variable can also be envisioned. In some exemplary configurations, the supply voltage can be a voltage regulator, or a DC-DC converter. In further exemplary configurations, the supply voltage can vary under control of an external control signal. In some configurations, the control signal can be a function of an envelope signal of the input RF signal, RFin, or the output RF signal, RFout. Detailed description of biasing methods and apparatus for stacked transistor amplifiers operating from a variable supply voltage can be found, for example, in the above referenced Published US Application No. US 2014/0184336 A1, Published US Application No.

2015/0270806 A1, and U.S. Pat. No. 9,219,445, the disclosures of which are incorporated herein by reference in their entirety. A person skilled in the art would also know of configurations where the supply to the amplifier is in the form of a current source instead of the exemplary voltage source (e.g., $V_{CC}$) discussed in the present disclosure. The teachings according to the present disclosure equally apply to such diverse supply configurations. The exemplary case of a fixed supply discussed in the present disclosure should not be considered as limiting what the applicant considers to be the invention. Furthermore, although an exemplary non-limiting case of a single ended RF amplifier configuration is discussed herein, the teachings according to the present disclosure equally apply to other amplifier configurations using stacked transistors, such as, for example, differential configurations. Some such configurations are described in, for example, the above referenced Published US Application No. 2014/0184335 A1, Published US Application No. US 2014/0184336 A1, and Published US Application No. 2014/0184337 A1, whose disclosures are incorporated herein by reference in their entirety.

As previously noted, although N-type MOSFETs are used in the exemplary RF amplifier (200) of FIG. 2, a person skilled in the art would recognize that other types of transistors such as, for example, P-type MOSFETs, can be used instead or in combination with the N-type MOSFETs. Furthermore, a person skilled in the art will also appreciate the advantage of stacking more than two transistors, such as three, four, five or more, provided on the voltage handling performance of the amplifier (200). This can for example be achieved when using non bulk-Silicon technology, such as insulated Silicon-on-Sapphire technology. In general, individual devices in the stack (e.g. T31, T32, T33, T34) can be constructed using CMOS, silicon germanium (SiGe), gallium arsenide (GaAs), gallium nitride (GaN), bipolar transistors, or any other viable semiconductor technology and architecture known. Additionally, different device sizes and types can be used within the stack of devices.

The RF amplifier (200) may be used within mobile handsets for current communication systems (e.g. WCMDA, LTE, LTE-CA, WiFi, etc.) wherein amplification of signals with frequency content of above 100 MHz and at power levels of above 50 mW is required. Such amplifiers may also be used to transmit power at frequencies and to loads as dictated by downstream splitters, cables, or feed network(s) used in delivering cable television service to a consumer, a next amplifier in an RF chain at a cellular base station; or a beam forming network in a phased array radar system, and other. The skilled person may find other suitable implementations for the present disclosure, targeted at lower (e.g. audio) frequency systems as well, such as audio drivers, high bandwidth laser drivers and similar. As such, it is envisioned that the teachings of the present disclosure will extend to amplification of signals with frequency content of below 100 MHz as well.

With further reference to the amplifier (200) depicted in FIG. 2, the biasing voltages at node ($V_{G4}$, $V_{G3}$, $V_{G2}$) are such that each transistor (T34, T33, T32, T31) of the stack is biased according to a voltage compliance of the transistor. In other words, a voltage across any two terminals (e.g., gate G4, G3, G2, G2, source S4, S3, S2, 51, and drain D4, D3, D2, D1) of the transistor is within a safe operating range of the transistor. As failure of transistor can be a statistical function of applied voltages across the transistors, even when such voltages are within the safe operating range, in some embodiments it may be desirable to subject the transistors of the stack to same voltage ranges so as to provide an equal life expectancy (e.g., mean time before failure) for each transistor of the stack.

With further reference to the RF amplifier (200) of FIG. 2, according to an exemplary embodiment, the gate biasing voltages at nodes ($V_{G4}$, $V_{G3}$, $V_{G2}$) can be configured to evenly distribute the voltage across the transistor stack, $V_{CC}$, amongst the stacked transistors (T34, T33, T32, T31). In other words, a drain to source voltage, $V_{DS}$, of each transistor (T34, T33, T32, T31) of the stack is made to be substantially equal to a quarter (¼) of the voltage provided by the supply voltage $V_{CC}$. This can be done, for example, as described in the above referenced Published US Application No. 2015/0270806 A1, whose disclosure is incorporated herein by reference in its entirety, by biasing the gates of the transistors (T34, T33, T32) with respective biasing voltages at nodes ($V_{G4}$, $V_{G3}$, $V_{G2}$) equal to $V_{CC} \times \frac{3}{4} + V_{GS}$, $V_{CC} \times \frac{2}{4} + V_{GS}$, and $V_{CC} \times \frac{1}{4} + V_{GS}$. According to other exemplary embodiment, unequal distribution of the voltage $V_{CC}$ amongst the stacked transistors may be provided, while operating each of the transistors of the stack within its safe operating range.

A person skilled in the art would understand that during operation of the amplifier (200), an amplified RF signal at the drain of the output transistor (T34) can be at a voltage level substantially higher than the $V_{CC}$ supply voltage. This means that if the gate voltage of the output transistor T34, as provided by the node $V_{G4}$, is maintained at a fixed voltage level, and therefore the source of T34 is maintained to a fixed voltage level (e.g., $V_{CC} \times \frac{3}{4} + V_{GS}$), then the drain to source voltage, $V_{DS}$, of the output transistor T34 can be subjected to higher voltage excursions (including the RF signal), which can be beyond the tolerable voltage range of the transistor. Unequal voltage distribution of the voltage $V_{CC}$ by way of gate biasing voltages, as discussed above, may help to reduce stress exerted on the output transistor T34 due to unequal RF voltage distribution across the transistors of the stack, but may not be sufficient.

Based on the above, it can be desirable to control the stress on the individual transistors of the stack, due to unequal RF voltage division of the voltage at the drain of the output transistor T34 across the transistors (T34, T33, T32, T31), which may subject any one of the transistors to a voltage beyond the tolerable voltage range of the transistor (e.g. close to or larger than its limit breakdown voltage). This can be accomplished by configuring the gates of the transistors (T34, T33, T32) of the stack to float via insertion of a gate capacitor (C4, C3, C2) as depicted in FIG. 2. The value of the gate capacitor is chosen so to allow the gate voltage to vary along (float) with the RF signal at the drain of the corresponding transistor, which consequently allows control of the voltage drop (e.g., $V_{DS}$) across the corresponding transistor, thus controlling the conduction of the transistor in accordance to the voltage at its drain, for a more efficient operation of the transistor. The voltage across the transistors (e.g. $V_{DS}$) can therefore be equalized by choosing the correct combination of gate capacitor and gate bias voltage for each of the transistors. Teachings about this floating technique, also referred to as conduction controlling circuit, can be found in the above referenced U.S. Pat. No. 7,248,120, which is incorporated herein by reference in its entirety.

A person skilled in the art would know that performance characteristic of the RF amplifier (200) depicted in FIG. 2 is mainly a function of a performance of the input transistor, T31. The input transistor T31 operates as a transconductor that translates an input voltage of the RFin signal to a current that conducts through the transistor stack (T34, T33, T32, T31) and ultimately defines a voltage at the drain of the output device T34. It is therefore desirable to have an input transistor of the stack with good output impedance ($V_{DS}/I_{DS}$). As a body tied device can provide a smoother $I_{DS}$ (drain-source current) versus $V_{DS}$ response curve, and does not exhibit the well-known kink which is characteristic of a floating body transistor, according to an embodiment of the present disclosure, the input transistor of the stack is a body tied device (e.g. T41 of FIG. 3A). As known to a person skilled in the art, such kink represents an abrupt decrease in output impedance of a floating transistor ($V_{DS}/I_{DS}$) and is not desirable in many RF applications as well as in lower frequency analog applications.

Figure 3A:
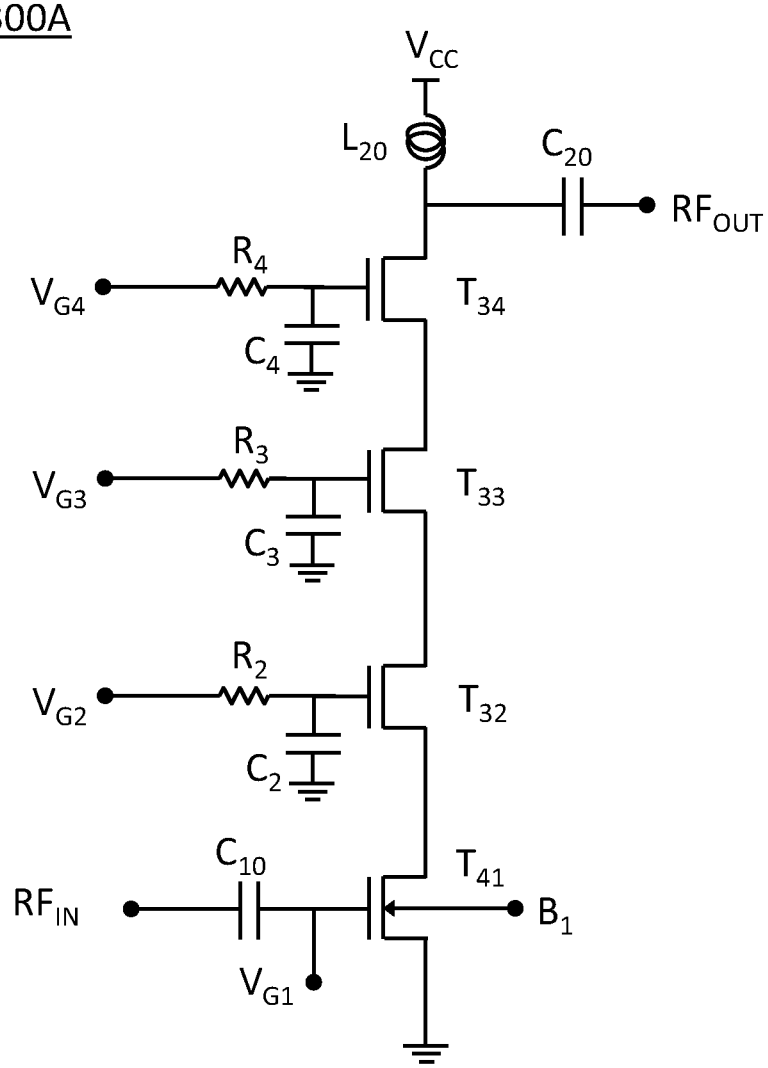
FIG. 3A shows a schematic representation of a transistor stack operating as an RF amplifier according to an exemplary embodiment of the present disclosure, where the transistor stack is formed by series connected three-terminal devices and a series connected four-terminal input device, a body of the input device being connected to an external potential.

FIG. 3A shows an exemplary embodiment according to the present disclosure where the input transistor, T41, of the RF amplifier (300A) is a four-terminal body tied device. The RF amplifier (300A) is similar in operation as the RF amplifier (200) described with reference to FIG. 2, with the added benefits of using a body tied device as the input transistor T41. One such benefit is the lower OFF state current $I_{DS}$ (leakage current) at elevated values of the drain to source voltage $V_{DS}$ provided by the four-terminal input transistor T41 as compared to the three-terminal input transistor of the RF amplifier (200) of FIG. 2. Moreover, the effective breakdown voltage (voltage $V_{DS}$ at which the current $I_{DS}$ reaches a certain level) can be higher for the case of the four-terminal transistor, which means that the input transistor T41 can allow for a higher input RF voltage swing while providing a same output impedance, and therefore a higher output power of the RF amplifier (300A). Applicant of the present disclosure has found that the RF amplifier configuration of FIG. 3A can provide a higher PAE as compared to the configuration of FIG. 2.

Figure 3B:
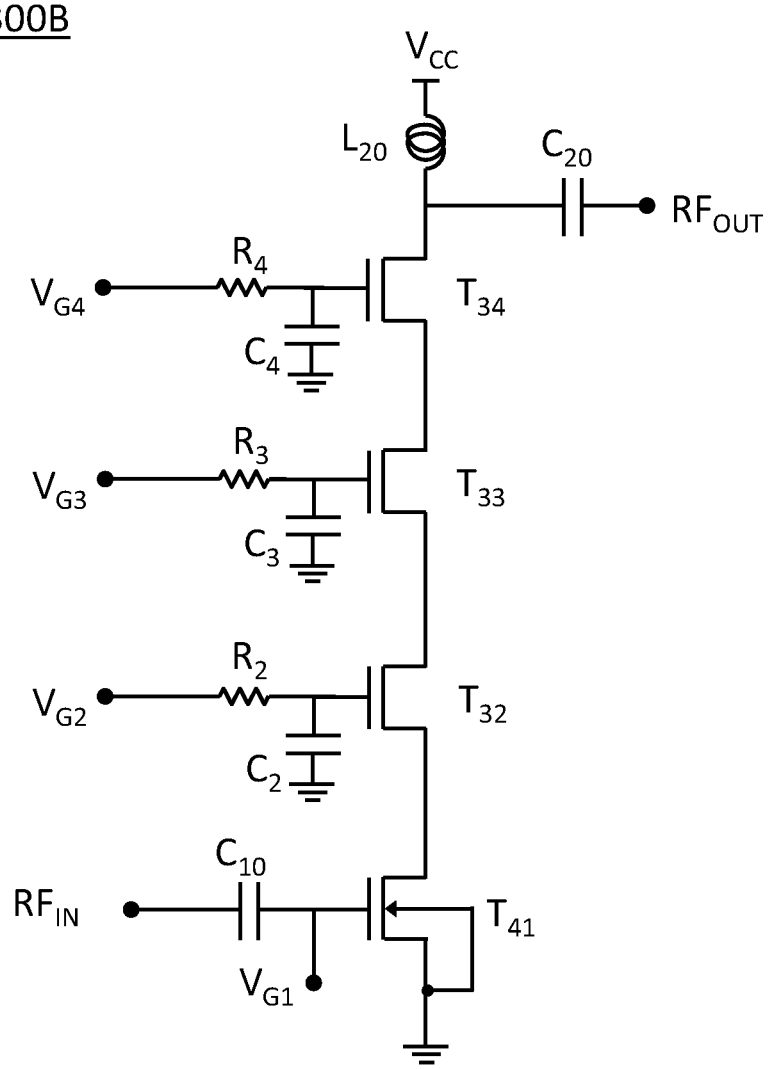
FIG. 3B shows a schematic representation of a transistor stack operating as an RF amplifier according to an exemplary embodiment of the present disclosure, where the transistor stack is formed by series connected three-terminal devices and a series connected four-terminal input device, the body of the output device being connected to the source of the input device.

In the exemplary embodiment of the present disclosure depicted in FIG. 3A, the body terminal B1 of the input transistor T41 of the RF amplifier (300A) is open, so as to allow any voltage to be tied to the body, including a fixed negative voltage. Alternatively, as shown in FIG. 3B, such body terminal may be tied to the source of the input transistor T41, the source being connected to ground.

Figure 4A:
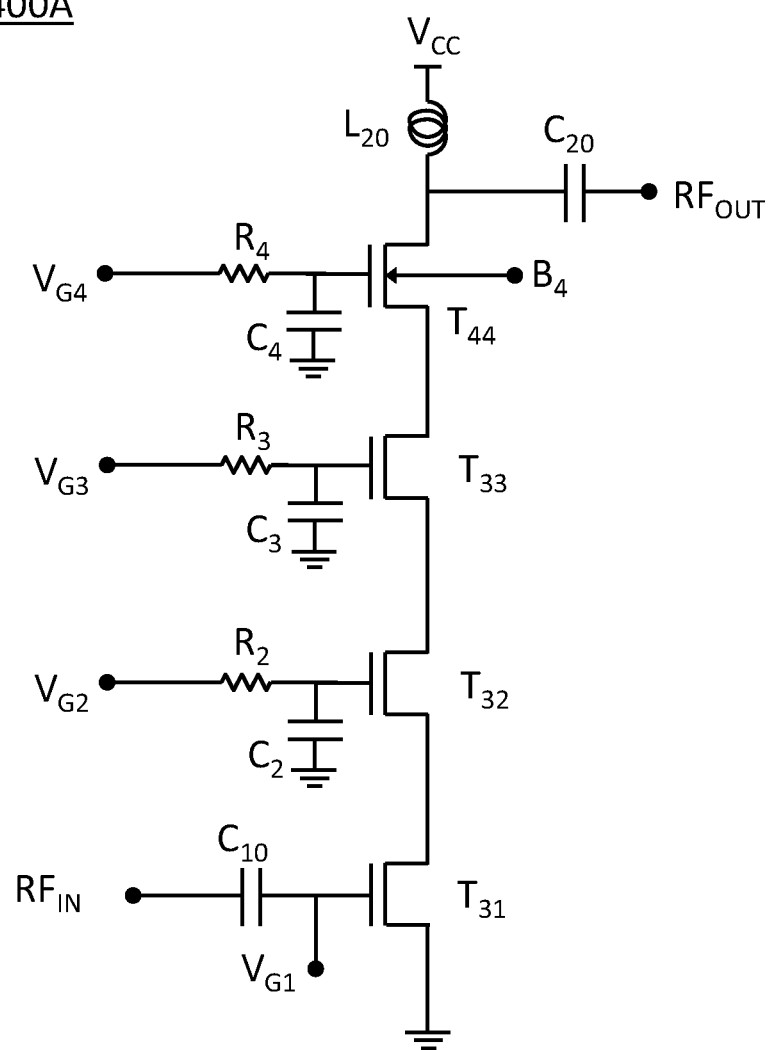
FIG. 4A shows a schematic representation of a transistor stack operating as an RF amplifier according to an exemplary embodiment of the present disclosure, where the transistor stack is formed by series connected three-terminal devices and a series connected four-terminal output device, the body of the output device being connected to an external potential.

As discussed above, the output transistor of the stack (e.g. T34 of FIG. 2) can be subjected, during operation, to higher voltage excursions, which can be beyond the tolerable voltage range of the output transistor. Although the configuration of FIG. 2 provides some means to control such higher excursions, it may be further desirable to provide increase voltage withstand capability to the output transistor. It follows that according to another exemplary embodiment of the present disclosure, an RF amplifier (400A) of FIG. 4A, is provided with a four-terminal output device T44, which, as discussed above, inherently can withstand a higher voltage. The RF amplifier (400A) is similar in operation as the RF amplifier (200) described with reference to FIG. 2, with the added benefits of using a body tied device as the output transistor T44, including increased voltage withstand capability.

Figure 4B:
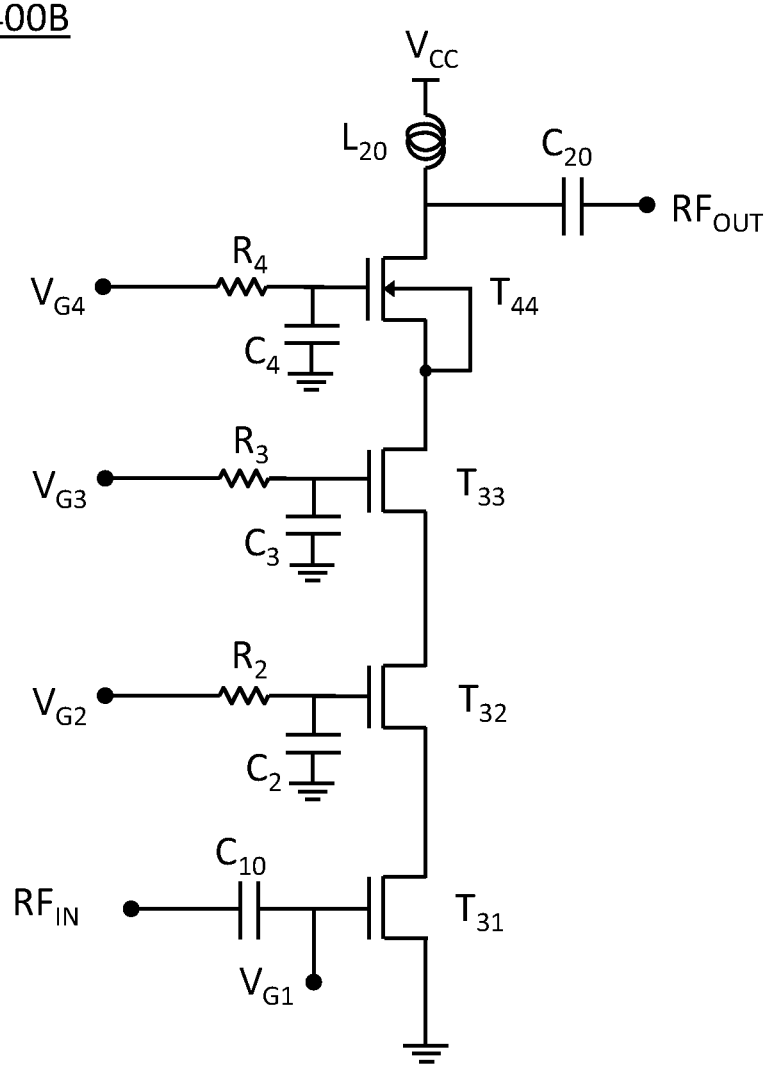
FIG. 4B shows a schematic representation of a transistor stack operating as an RF amplifier according to an exemplary embodiment of the present disclosure, where the transistor stack is formed by series connected three-terminal devices and a series connected four-terminal output device, the body of the output device being connected to a source of the output device which is connected to a drain of an adjacent transistor of the stack.

In the exemplary embodiment of the present disclosure depicted in FIG. 4A, the body terminal B4 of the output transistor T44 of the RF amplifier (400A) is open, so as to allow any voltage to be tied to the body. Alternatively, as shown in FIG. 4B, such body terminal may be tied to the source of transistor T44, the source being connected to the drain of the transistor T33.

Figure 5A:
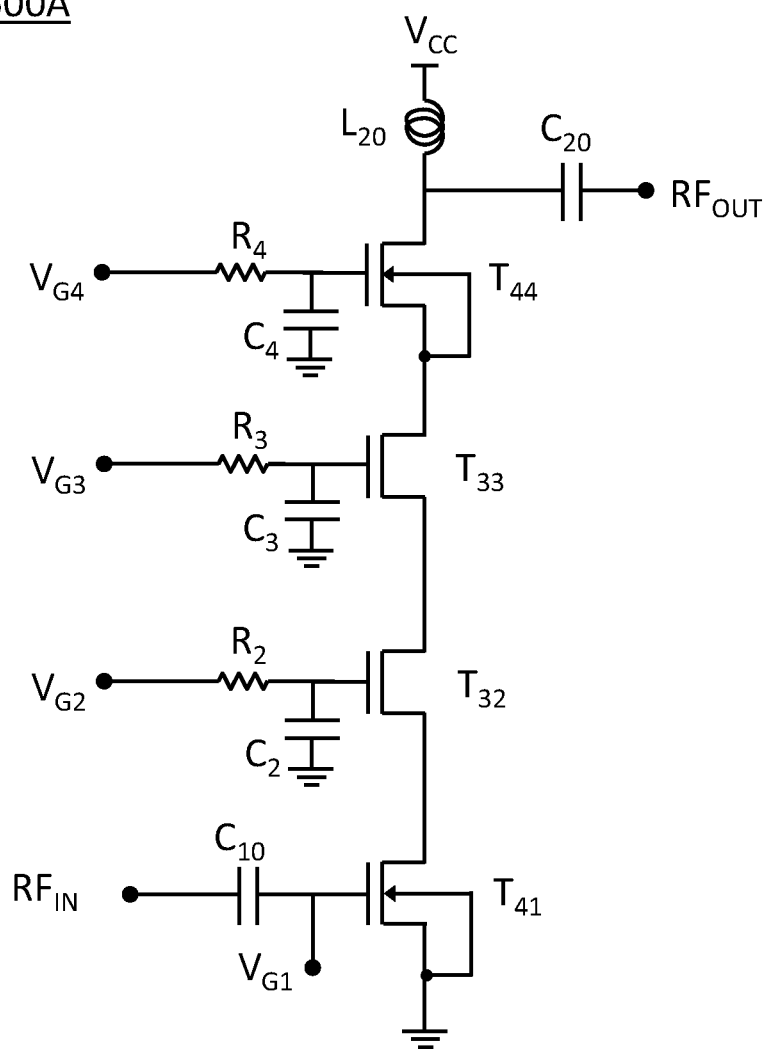
FIG. 5A shows a schematic representation of a transistor stack operating as an RF amplifier according to an exemplary embodiment of the present disclosure, where the transistor stack is formed by series connected three-terminal devices, a series connected four-terminal input device, and a series connected four-terminal output device, the body of the input device and the body of the output device being connected to the source of the input device and the source of the output device respectively.

FIG. 5A shows an exemplary embodiment according to the present disclosure where an input transistor T41, and an output transistor T44, of an RF amplifier (500), are both four-terminal devices. The RF amplifier (500) can be have the added benefits of a body tied input device and a body tied output device as described with reference to FIGS. 3A/3B and 4A/4B.

Figure 5B:
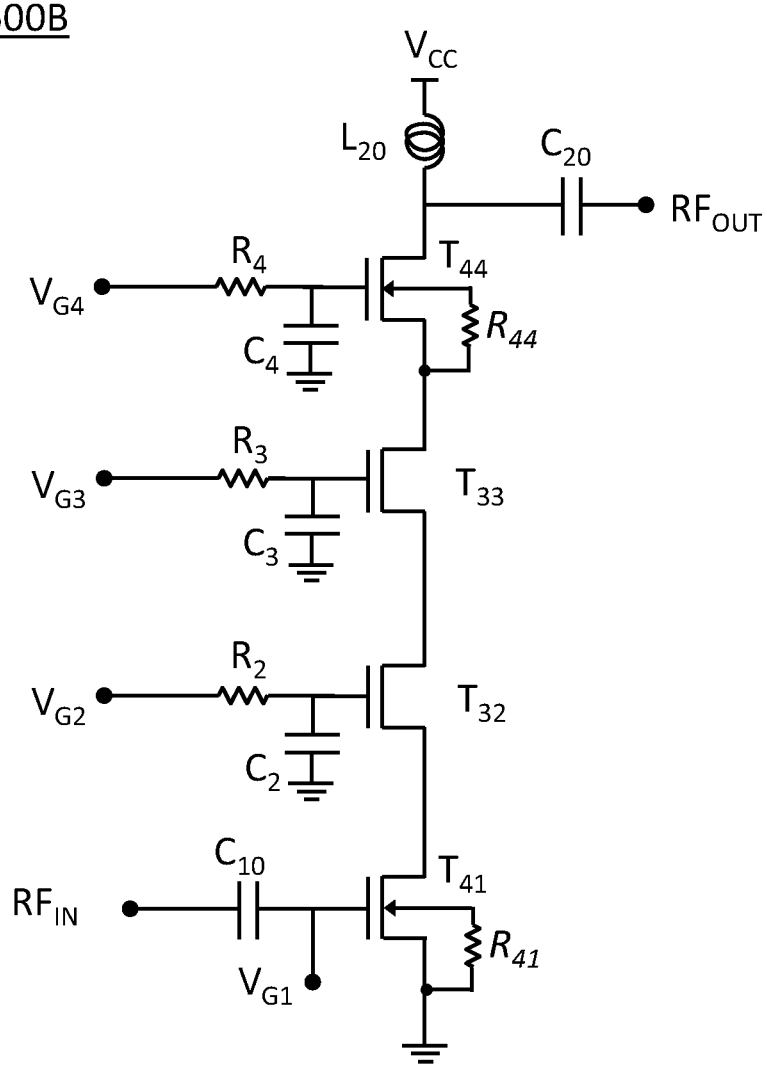
FIG. 5B shows a more detailed schematic representation of the RF amplifier of FIG. 5A, including an impedance in the body ties.

It should be noted that resistivity of a body tie provided by a corresponding conduction path between the body of a device and its body terminal (contact) can be a design parameter. FIG. 5B shows corresponding body tie impedances (R41, R44). According to some exemplary embodiment of the present disclosure, such impedances (e.g., resistances) can have a same value or different values.

As is well known to a person skilled in the art, when operating at high bias voltage and high RF power, the voltage of the body region of a transistor (e.g. transistor in any of the above described figures) of an RF amplifier can increase due to generated carriers. For a floating body device, body potential increases, and can follow the high bias voltage and the high RF power with a relatively slow response (large time constant). This means that in response to fast changes in bias voltage and/or RF power, the floating body device reacts slowly and according to its relatively long time constant. Therefore, a transient response of an RF amplifier can be affected by presence of a floating device. On the other hand, the generated carriers in a body tied device are swept out via the provided conduction path of the body tie which can therefore maintain a potential of the body at a desired value as provided at the body tie terminal, thus improving response of the device with respect to changing biasing voltage and/or RF power. It follows that according to an exemplary embodiment of the present disclosure depicted in FIG. 6A, an RF amplifier (600A) is provided whose transistor stack comprises all four-terminal devices for an improves transient response of the RF amplifier with respect to changing operating modes of the RF amplifier defined by changes in biasing voltages and/or RF power.

Figure 6A:
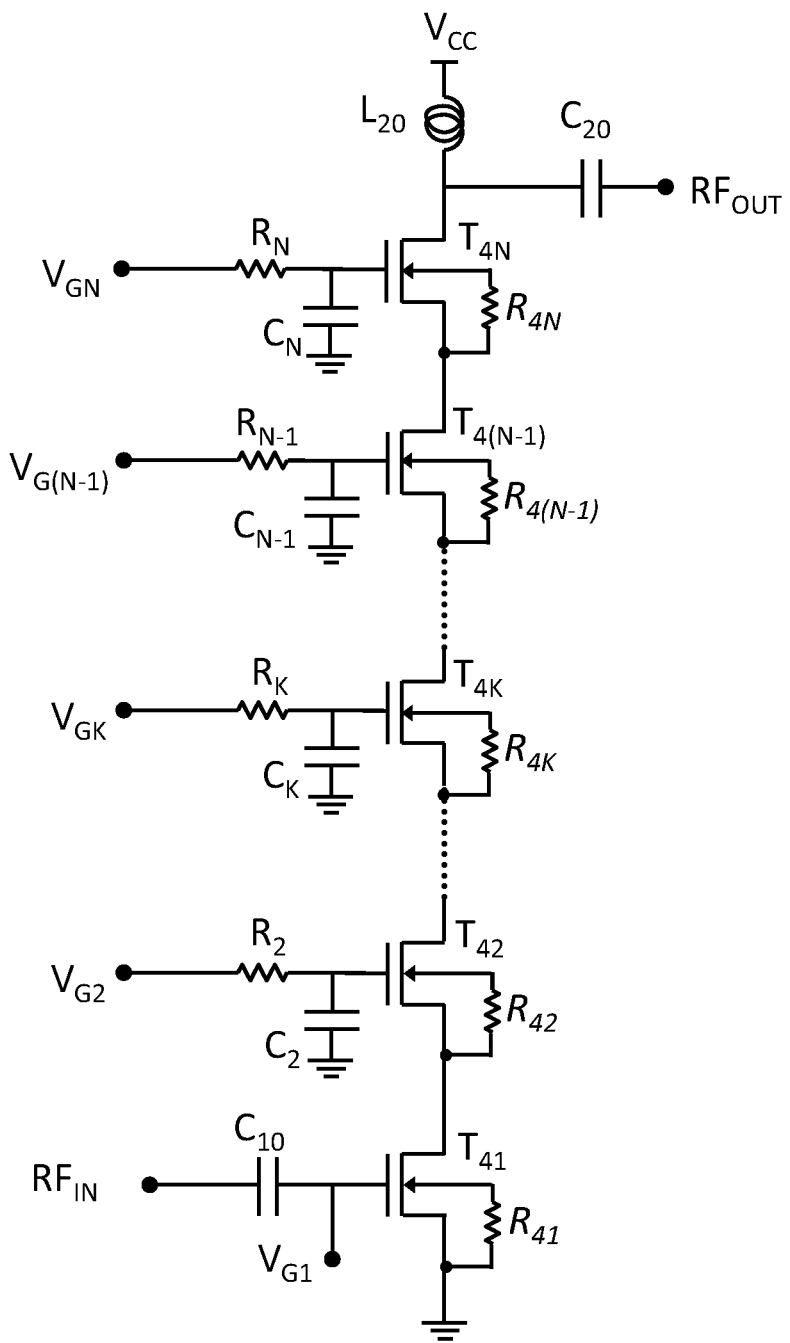
FIG. 6A shows a schematic representation of a transistor stack operating as an RF amplifier according to an exemplary embodiment of the present disclosure, where the transistor stack is formed by series connected four-terminal devices.

With continued reference to the RF amplifier (600A) of FIG. 6A, a height, N, of the stack of transistors can be of any value and dependent, for example, to the supply voltage $V_{CC}$ and a withstand voltage of the four-terminal devices (T41, T42 . . . , T4N). As discussed above, an impedance (e.g., resistance) value (R41, R42 . . . , R4N) associated to body ties of the transistors is also shown in the figure. By virtue of using exclusively four-terminal devices, for a given height of the transistor stack, the RF amplifier (600A) can provide a faster transient response as compared to the RF amplifier (200) or any of the above described RF amplifiers having at least one floating device (for a given height of the stack). Other benefits related to using a body tied input transistor, T41, and a body tied output transistor, T4N, as described with reference to FIG. 3A and FIG. 4A equally apply to the configuration of FIG. 6A.

With further reference to the RF amplifier (600A) of FIG. 6A, due to the higher withstand voltage capability of its body tied transistors, a height of the stack for a given desired output voltage/power may be reduced, for a saving in power consumption of the RF amplifier as compared to, for example, the configuration shown in FIG. 2. In other words, more of the lower withstand voltage floating transistors are needed to distribute a same supply voltage, $V_{CC}$, as compared to using the higher withstand voltage body tied transistors.

Figure 6B:
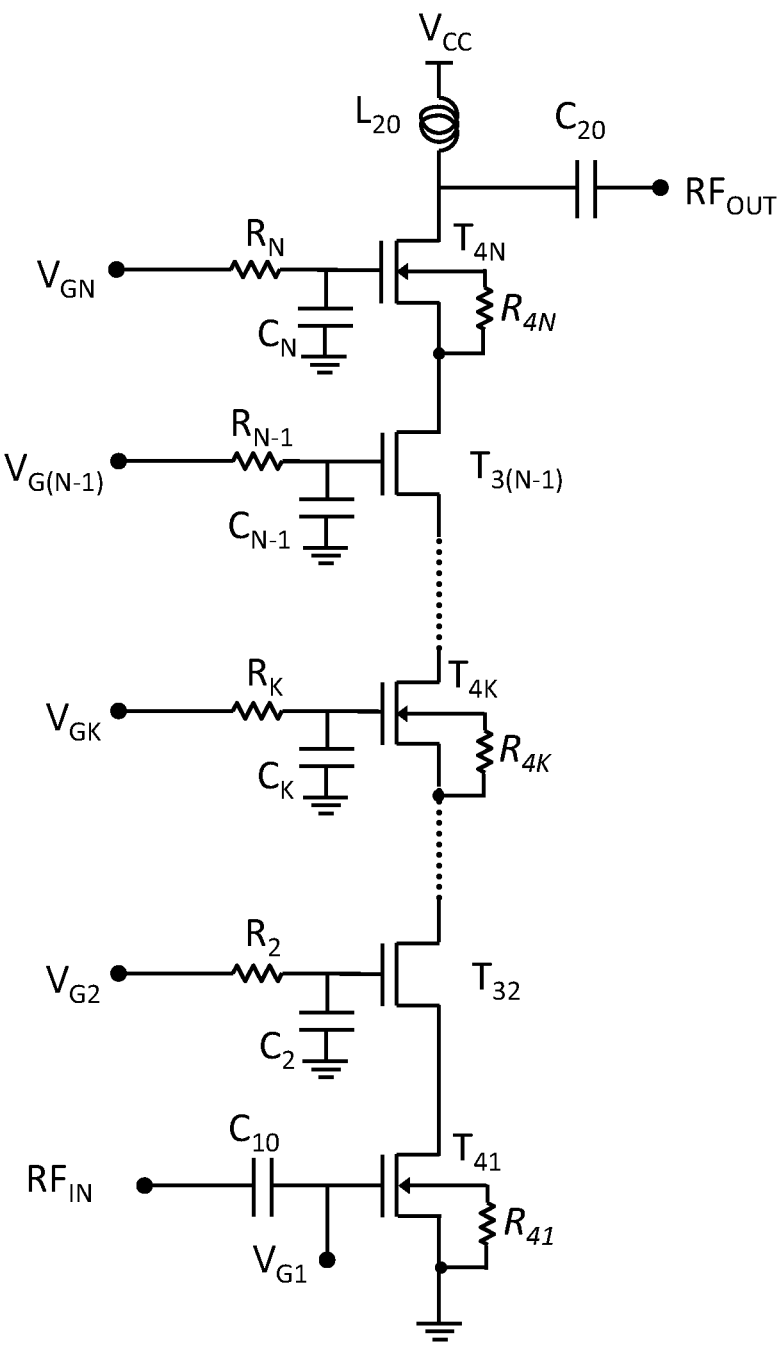
FIG. 6B shows a schematic representation of a transistor stack operating as an RF amplifier according to an exemplary embodiment of the present disclosure, where the transistor stack is formed by series connected three-terminal and four-terminal devices.

The teachings according to the present disclosure, therefore provide the tools to optimize performance of an RF amplifier using staked transistors by allowing a mixture of three-terminal and four-terminal devices in the stack. Some such benefits can be readily understood based on the above description. In other cases, design goals and corresponding RF amplifier layouts may result (e.g. through simulation) in different stack configurations comprising a combination of one or more three-terminal devices and one or more four terminal devices, as shown in FIG. 6B.

The exemplary non-limiting embodiment, according to the present disclosure, of an RF amplifier with stacked transistors in a cascoded configuration can be used, for example, in radio frequency (RF) amplifiers, including, but not limited to, RF power amplifiers and cellular RF power amplifiers operating at various classes of operation, including, but not limited to, switching class D, E and F, saturated class B and C, and linear class A and A/B.

Although the exemplary non-limiting embodiment described above are made with respect to an RF amplifier using staked transistors, the teachings of the present disclosure can equally apply to any other applications where stacked transistors are used, including, for example, general analog circuits, power amplifiers (PAs), low noise amplifiers (LNAs), analog to digital converters (ADCs), voltage controlled oscillators (VCOs), and voltage reference circuits at frequencies ranging from DC to 100 GHz and beyond.

It should be noted that although the various exemplary embodiments according to the present disclosure are provided using an exemplary case of an N-type SOI MOSFET, such exemplary case is provided mainly for clarity purposes. The various embodiments according to the present invention can be equally adapted to other transistor types and other transistor technologies, especially where the source and/or the drain regions extend down to an insulating layer such as a "BOX" layer of an SOI device.

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures). Integrated circuit embodiments may be fabricated using any suitable substrates and processes, including but not limited to standard bulk silicon, silicon-on-insulator (SOI), silicon-on-sapphire (SOS), GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 10 GHz, and particularly above about 20 GHz). Monolithic IC implementation is particularly useful since parasitic capacitances generally can be kept low by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

It may be possible to execute the activities described herein in an order other than the order described. Various activities described with respect to the methods identified herein can be executed in repetitive, serial, or parallel fashion.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived there-from, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is, in fact, disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the present disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

The invention claimed is:

1. A stacked metal-oxide-semiconductor (MOS) power amplifier, comprising:
a transistor stack comprising a plurality of stacked transistors comprising an input transistor and an output;
wherein the input transistor comprises a four-terminal transistor having a body directly connected to a source of the four-terminal transistor,
wherein the plurality of stacked transistors comprises at least one three-terminal transistor, and wherein the at least one three-terminal transistor comprises a body that is not coupled to a potential.

2. The MOS power amplifier according to claim 1, further comprising:
at least one gate capacitor connected between a gate of a transistor of the plurality of stacked transistors different from the input transistor, and a reference ground,
wherein the at least one gate capacitor is configured to allow a gate voltage of the corresponding transistor to vary along with an RF signal at a drain of said transistor.

3. The MOS power amplifier according to claim 1, wherein the plurality of transistors are metal-oxide-semiconductor (MOS) field effect transistors (FETs), or complementary metal-oxide-semiconductor (CMOS) field effect transistors (FETs).

4. The MOS power amplifier according to claim 3, wherein the plurality of transistors are fabricated using one of: a) silicon-on-insulator (SOI) technology, and b) silicon-on-sapphire technology (SOS).

5. The MOS power amplifier according to claim 3, wherein the plurality of transistors are one of: a) N-type transistors, and b) P-type transistors.

6. The MOS power amplifier according to claim 1,
wherein the transistor stack is configured to operate between a supply voltage coupled to the output transistor and a reference ground coupled to the input transistor, and
wherein the supply voltage is configured to vary under control of a control signal.

7. An electronic module comprising the MOS power amplifier of claim 1.

8. An electronic system comprising the electronic module of claim 7, wherein the electronic system comprises one of: a) a television, b) a cellular telephone, c) a personal computer, d) a workstation, e) a radio, f) a video player, g) an audio player, h) a vehicle, i) a medical device, and j) other electronic systems.

9. A stacked metal-oxide-semiconductor (MOS) power amplifier, comprising:
a transistor stack comprising a plurality of stacked transistors comprising an input transistor for receiving an input RF signal, and an output transistor for outputting an output RF signal that is an amplified version of the input RF signal;
at least one gate capacitor connected between a gate of a transistor of the plurality of stacked transistors different from the input transistor, and a reference ground,
wherein at least one transistor of the plurality of stacked transistors is a four-terminal transistor having a body that is coupled to a source of said transistor,
wherein the plurality of stacked transistors comprises at least one three-terminal transistor, wherein the at least one three-terminal transistor comprises a body that is not coupled to a potential, and
wherein the body of the at least one transistor is directly connected to the source of said transistor.

10. The MOS power amplifier according to claim 9,
wherein the at least one gate capacitor is configured to allow a gate voltage of the corresponding transistor to vary along with an RF signal at a drain of said transistor.

11. The MOS power amplifier according to claim 9, wherein the at least one transistor of the plurality of stacked transistors further comprises the output transistor.

12. The MOS power amplifier according to claim 9, wherein the at least one transistor of the plurality of stacked transistors further comprises a transistor arranged between the input transistor and the output transistor.

13. The MOS power amplifier according to claim 9, wherein each transistor of the plurality of stacked transistors, except the at least one three-terminal transistor, is a four-terminal transistor having a respective body that is coupled to a respective source.

14. The MOS power amplifier according to claim 9, wherein the plurality of transistors are metal-oxide-semiconductor (MOS) field effect transistors (FETs), or complementary metal-oxide-semiconductor (CMOS) field effect transistors (FETs).

15. The MOS power amplifier according to claim 9,
wherein the transistor stack is configured to operate between a supply voltage coupled to the output transistor and the reference ground coupled to the input transistor, and
wherein the supply voltage is configured to vary under control of a control signal.

16. An electronic module comprising the MOS power amplifier of claim 9.

17. A method for manufacturing a stacked metal-oxide-semiconductor (MOS) power amplifier, the method comprising:
providing a substrate comprising one of: a) silicon-on-insulator substrate, and b) a silicon-on-sapphire substrate; and
manufacturing, on the substrate, a transistor stack, the transistor stack comprising:
a plurality of series connected transistors comprising an input transistor and an output transistor,
wherein the input transistor comprises a four-terminal transistor having a body directly connected to a source of the four-terminal transistor,
wherein the plurality of series connected transistors comprises at least one three-terminal transistor, and wherein the at least one three-terminal transistor comprises a body that is not coupled to a potential.

* * * * *